(12) United States Patent
Boas et al.

(10) Patent No.: US 11,644,487 B2
(45) Date of Patent: May 9, 2023

(54) CIRCUITS AND METHODS FOR TRACKING MINIMUM VOLTAGE AT MULTIPLE SENSE POINTS

(71) Applicant: NXP B.V., Eindhoven (NL)

(72) Inventors: Andre Luis Vilas Boas, Campinas (BR); Bruno Caceres Carrilho, Campinas (BR); Andre Gunther, San Jose, CA (US); Jeffrey Alan Goswick, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 17/236,227

(22) Filed: Apr. 21, 2021

(65) Prior Publication Data

US 2022/0341975 A1 Oct. 27, 2022

(51) Int. Cl.

| | |
|---|---|
| *G01R 19/165* | (2006.01) |
| *G08B 21/18* | (2006.01) |
| *H03K 17/687* | (2006.01) |
| *H03K 5/24* | (2006.01) |

(52) U.S. Cl.
CPC ..... *G01R 19/16576* (2013.01); *G08B 21/182* (2013.01); *H03K 5/24* (2013.01); *H03K 17/687* (2013.01)

(58) Field of Classification Search
CPC ............ G01R 19/165; G01R 19/16533; G01R 19/16566; G01R 19/16571; G01R 19/16576; G01R 19/1659; H03K 5/22; H03K 5/24; H03K 5/2472; H03K 5/2481; H03K 17/687; G08B 21/182
See application file for complete search history.

(56) References Cited

U.S. PATENT DOCUMENTS

| | | | | |
|---|---|---|---|---|
| 7,135,842 | B2 * | 11/2006 | Banerjee | ................... G05F 1/56 323/280 |
| 9,374,716 | B2 | 6/2016 | Enescu et al. | |
| 9,983,602 | B2 | 5/2018 | Raja et al. | |
| 10,069,409 | B2 | 9/2018 | Bulzacchelli et al. | |
| 2006/0170402 | A1 * | 8/2006 | Banerjee | ................... G05F 1/56 323/273 |

* cited by examiner

*Primary Examiner* — Long Nguyen (57) ABSTRACT

An integrated circuit including a comparator having a first input to receive a reference voltage, a second input, and an output to provide an under-voltage indicator. Sense points are configured to provide a plurality of sense point voltages, each sense point providing a corresponding sense point voltage of the plurality of sense point voltages; and a minimum voltage tracking circuit configured to receive the plurality of sense point voltages and provide an output voltage which tracks whichever sense point voltage of the plurality of sense point voltages is currently a minimum sense point voltage. The comparator receives the output voltage at the second input and asserts the under-voltage indicator when the output voltage is below the reference voltage.

17 Claims, 5 Drawing Sheets

CIRCUITS AND METHODS FOR TRACKING MINIMUM VOLTAGE AT MULTIPLE SENSE POINTS

BACKGROUND

Field

This disclosure relates generally to integrated circuits, and more specifically, to detecting low voltage at multiple sense points in an integrated circuit.

Related Art

Various processing devices are utilized in conjunction with voltage regulators, which provide a regulated power-supply voltage for driving the processing platform or logic architecture of the device. The processing platform may contain any number of integrated circuit (IC) processing regions, such as different cores providing analog and/or digital signal processing functions, memory structures, or different domains within a core, one or more of which may be power-gated. The process platform may be integrated into a given IC die by interconnecting various transistors or gates having a predetermined layout, such as a Sea-of-Gates (SoG) architecture.

On-chip undervoltage or low-voltage detectors (LVD) can be used to reset digital logic in a semiconductor die or chip in case of an under-voltage condition that could otherwise corrupt the logic state and cause unintended behavior. A digital core power grid can be coupled to two or more voltage supply points (VDD) that can be external chip supply connections or connections to a single on-chip voltage regulator. Depending on the current drawn at each location, a voltage drop will occur. Furthermore, the voltage drop will depend on the impedance between the current sink and the supply, which varies for each location across the entire die.

The currents are dynamic in nature, and local decoupling capacitors may play an important role as well. The currents also change according to the various chip operating modes, regulator voltage variation, power supply gating, and other factors. Therefore, the location where the greatest voltage drop occurs can change over time and operating conditions. Some common situations where under-voltage conditions can occur include, during power ramp up, when the voltage regulator ramps up the internal power supply to the desired value; when a new, higher voltage setting is programmed into the regulator during dynamic voltage and frequency scaling (DVFS) and the regulator has to slew to the new voltage setting; during certain failures caused by device hacking, external power corruption or defects; and during abrupt increases in circuit activity resulting in a step increase in grid current.

Usually the sense point for a LVD is near the lowest voltage point on the Sea of Gates (SoG), which can depend on the current drawn and the parasitic routing resistance of the power grid. The low point will thus depend on the layout of the chip as well as the operating mode of the logic. Due to the dependency on the chip operation, a single low point on the chip is difficult to identify as there may be multiple potential low points across the die.

As technologies shrink, it is desirable to minimize the voltage overhead in order to optimize dynamic power consumption. Therefore, it is important to be able to sense the minimum SoG voltage independent of its location, in order to allow the power management subsystem to operate at the minimum supply voltage without compromising data integrity.

Additionally, being able to sense the minimum operating voltage helps reduce the amount of current/resistance (IR) analysis required, thus speeding product development and improving the resilience of the resulting system.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments disclosed herein provide a minimum voltage tracking or under-voltage detector circuit to help determine safe and reliable operating conditions for digital circuits. The minimum voltage tracking circuit is coupled to multiple sense points in a power grid. The minimum voltage from the multiple sense points is provided to a comparator, which determines whether the minimum voltage is below a predetermined reference voltage. If the minimum voltage is below the reference voltage, and undervoltage indicator can be generated and provided to functional safety or diagnostic circuitry to determine an appropriate course of action. The undervoltage indicator can be latched to capture the undervoltage indicator during transient events. Monitoring multiple locations simultaneously to detect any point with a voltage drop below the safe operating level of the logic circuits helps improve reliability and safety of a low-voltage regulator, as well as to digital logic circuitry that relies on power from the low-voltage regulator.

Figure 1:
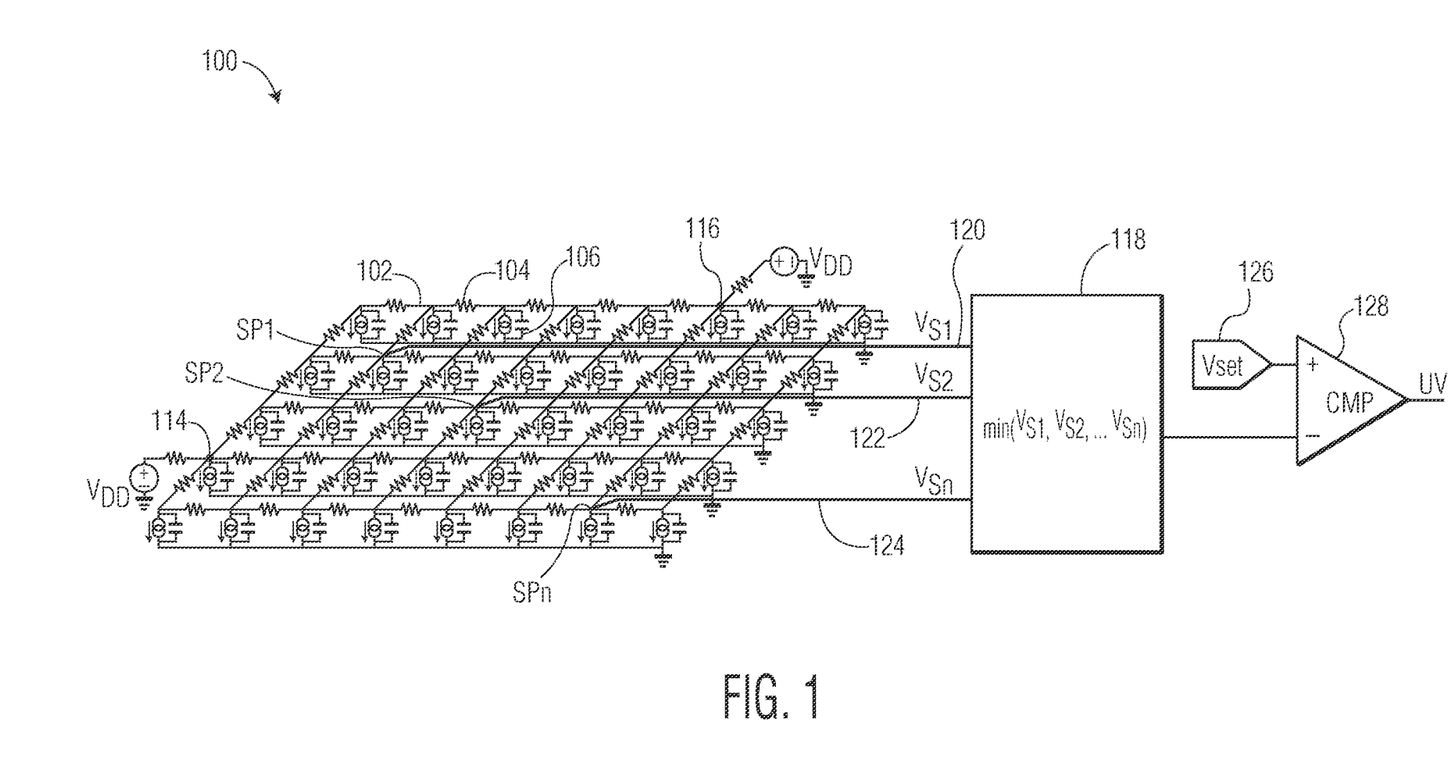
FIG. 1 illustrates a schematic diagram of components of a digital core power grid coupled to a minimum voltage detection circuit that uses multiple spatially distributed sense points for monitoring low-voltage in the power grid in accordance with selected embodiments of the present invention.

FIG. 1 illustrates a schematic diagram of components of digital core power grid 102 coupled to a minimum voltage tracking circuit 118 that uses multiple spatially distributed sense points SP1, SP2, SPn for monitoring low-voltage in power grid 102 in accordance with selected embodiments of the present invention. In the example shown, power grid 102 is coupled to the supply voltage VDD at two nodes 114, 116, however a different number of nodes coupled supply voltage VDD can be included. Power grid 102 includes a matrix of parasitic resistive elements 104 with resistive elements 104 coupled in series with one another along rows of the matrix and along columns of the matrix. Resistive elements 104 represent resistance in the wires in power grid 102. A sea of gates typically has a very large number of connections to power grid 102. The locations where the rows and columns intersect are referred to as nodes where groups of logic gates are coupled to grid 102. Current source 106 is shown at the intersection of each row and column to indicate any current that is drawn by a load coupled to the node. Although not shown in FIG. 1, current sources 106 are coupled to ground.

Sense points SP1, SP2, SPn can be positioned at different nodes in power grid 102. Conductors 120, 122, 124 are coupled between each of sense points SP1, SP2, SPn and inputs to minimum voltage tracking circuit 118. Minimum voltage tracking circuit 118 determines the minimum value from among all the sense voltage inputs, shown as VS1, VS2 . . . VSn, through conductors 120, 122, 124. Any suitable number of sense points SPn and corresponding conductors, transistors, and other components, can be included in minimum voltage tracking circuit 118. The minimum value output from minimum voltage tracking circuit 118 is provided as an input to a negating terminal of comparator 128. A non-negating input of comparator 128 is coupled to a reference voltage 126, shown as VREF. The output of comparator 128 is an under-voltage indicator (UV) that is asserted if the minimum voltage at one of the sense points SP1, SP2, SPn in power grid 102 is less than reference voltage 126.

Figure 2:
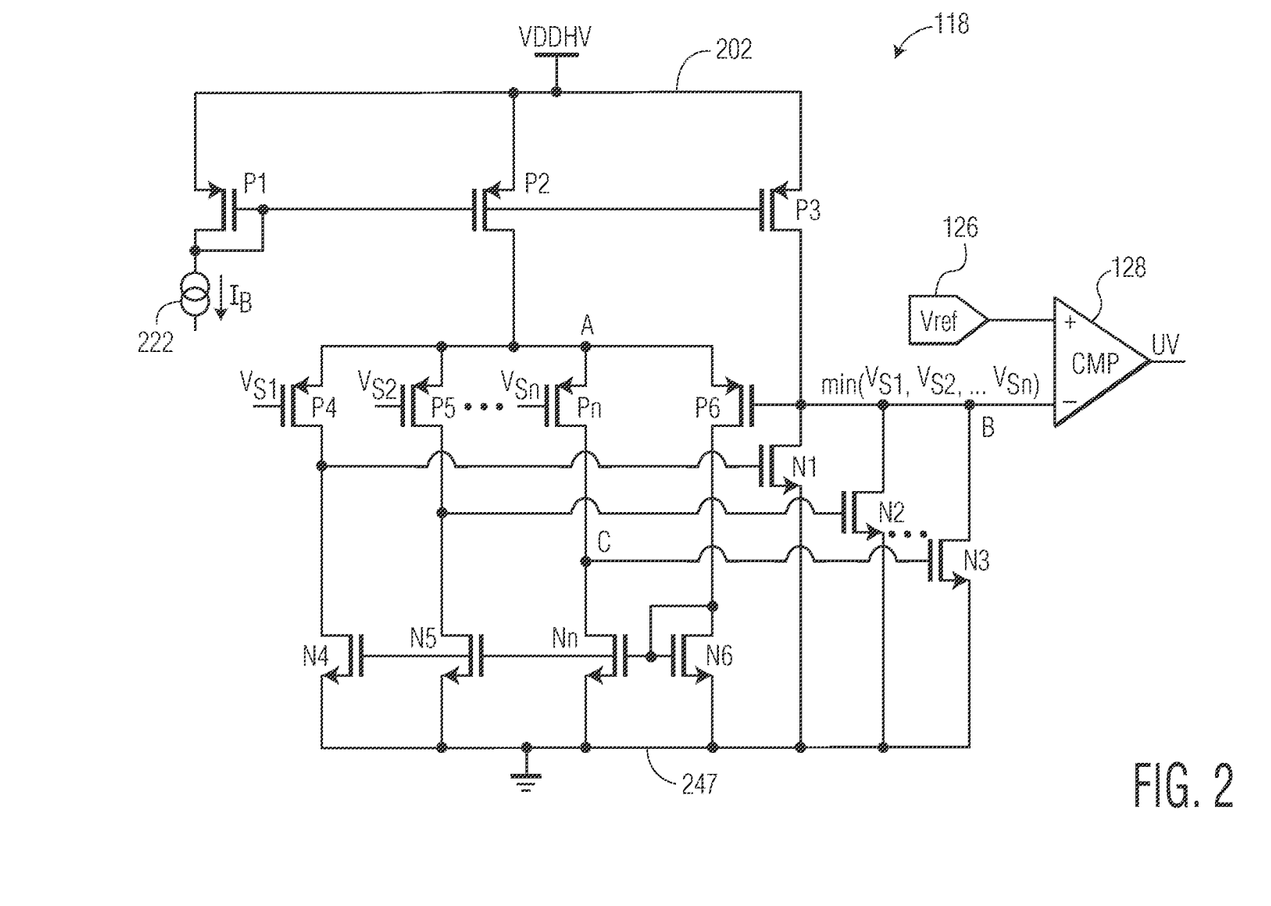
FIG. 2 illustrates a schematic diagram of an integrated circuit for a minimum low-voltage detector circuit that can be used with the digital core power grid of FIG. 1 in accordance with selected embodiments of the invention.

FIG. 2 illustrates a schematic diagram of minimum voltage tracking circuit 118 that can be used with digital core power grid 102 of FIG. 1 in accordance with selected embodiments of the invention. In the example shown, minimum voltage tracking circuit 118 includes P-channel transistors P1-P3, N-channel transistors N1-N6, supply voltage rail 202, ground voltage rail 247, and bias current source 228. Supply voltage rail 202 is connected to a power supply voltage greater than grid voltage VDD. For example, the voltage on supply voltage rail 202 can be a high voltage VDDHV that exceeds supply voltage VDD of power grid 102 by threshold voltage of transistors P1-P3 plus twice the drain source of voltage of transistors P1-P3, that is, VDD< (VDDHV-VT-2VDS), to provide sufficient common mode input range. ground voltage rail 247 is connected to a power supply voltage VSS or ground. Bias current source 228 provides bias voltage the input stage of minimum voltage tracking circuit 118.

P-channel transistor P1 functions as a diode-connected element and includes a source electrode coupled to supply voltage rail 202, a drain electrode coupled to a first terminal of bias current source 228, and a control gate coupled to the drain electrode of P-channel transistor P1 and to the control gates of P-channel transistors P2, P3. Transistors P2 and P3 function as matched current sources. Other configurations that provide matched current sources, such as cascoded transistors, among others, can be used in minimum voltage tracking circuit 118. P-channel transistor P2 includes a source electrode coupled to supply voltage rail 202, a drain electrode coupled to source electrodes of P-channel transistors P4 through P6, and a control gate coupled to the control gates of P-channel transistors P1, P3. P-channel transistor P3 includes a source electrode coupled to supply voltage rail 202, a drain electrode coupled to a drain electrode of N-channel transistor N1, and a control gate coupled to the control gates of P-channel transistors P1, P2.

P-channel transistors P4-P6 each include a source electrode coupled to the drain electrode of P-channel transistor P2. P-channel transistor P4 further includes a drain electrode coupled to a drain electrode of N-channel transistor N4, and a control gate coupled to first sense point voltage VS1. P-channel transistor P5 further includes a drain electrode coupled to a drain electrode of N-channel transistor N5, and a control gate coupled to second sense point voltage VS2. P-channel transistor Pn further includes a drain electrode coupled to a drain electrode of N-channel transistor Nn, and a control gate coupled to nth sense point voltage VSn. P-channel transistor P6 further includes a drain electrode coupled to a drain electrode of N-channel transistor N6, and a control gate coupled to the negating input of comparator 128.

N-channel transistor N4 includes a drain electrode coupled to the drain electrode of P-channel transistor P4, a source electrode coupled to ground voltage rail 247, and a control gate coupled to the control gates of N-channel transistors N5, Nn, N6. N-channel transistor N5 includes a drain electrode coupled to the drain electrode of P-channel transistor P5, a source electrode coupled to ground voltage rail 247, and a control gate coupled to the control gates of N-channel transistors N4, Nn, N6. N-channel transistor Nn includes a drain electrode coupled to the drain electrode of P-channel transistor Pn, a source electrode coupled to ground voltage rail 247, and a control gate coupled to the control gates of N-channel transistors N4, N5, N6. N-channel transistor N6 includes a drain electrode coupled to the drain electrode of P-channel transistor P6, a source electrode coupled to ground voltage rail 247 and to the control gate of N-channel transistor N6, and a control gate coupled to the control gates of N-channel transistors N4, N5, Nn.

N-channel transistor N1 includes a drain electrode coupled to the gate electrode of P-channel transistor P6, a source electrode coupled to ground voltage rail 247, and a control gate coupled to the drain electrode of N-channel transistor N4. N-channel transistor N2 includes a drain electrode coupled to the gate electrode of P-channel transistor P6, a source electrode coupled to ground voltage rail 247, and a control gate coupled to the drain electrode of N-channel transistor N5. N-channel transistor N3 includes a drain electrode coupled to the gate electrode of P-channel transistor P6, a source electrode coupled to ground voltage rail 247, and a control gate coupled to the drain electrode of N-channel transistor Nn.

During operation, due to the manner in which the respective gate contacts of P-channel transistors P4-Pn are directly coupled to or connected multiple sense points SP1, SP2 . . . SPn distributed throughout power grid 102 (FIG. 1), the P-channel transistor P4 through Pn receiving the lowest input voltage VS1, VS2 . . . VSn (as applied to the transistor's gate electrode from the respective sense point) thus determines the voltage at node A, thus inhibiting the other branches from carrying the bias current of P2, thereby carrying the current. This closes the feedback from the output voltage through P6 and N6 and thus replicates the lowest VSx at the output. The transistor P4-Pn with the lowest input voltage at a given juncture in time is referred to hereafter as the "current minimum sense point transistor." Further, as stated above, the current minimum sense point transistor (again, the P-channel transistor P4-Pn to which the lowest sensed voltage is applied from SP1, SP2 . . . SPn) forms a buffer amplifier with the other interconnected transistors to replicate the voltage sensed at the negating input to comparator 128 (labeled as node B in FIG. 2). Further, N-channel transistors N4-Nn function as a current mirror, while the N-channel transistor N6 acts a diode-connected element (here, a diode-connected MOSFET having connected gate and drain terminals).

Consider an example scenario in which P-channel transistor Pn is the current minimum sense point transistor due TO the application of a minimum voltage to the gate electrode of transistor Pn via SPn. In the illustrated embodiment, the source of the P-channel transistor Pn is connected to node A at the drain electrode of P-channel transistor P2, while the drain of P-channel transistor Pn is connected to node C at the drain electrode of N-channel transistor Nn. The gate of N-channel transistor N3 is further connected to the output of P-channel transistor Pn via node C, while the respective source terminals of P-channel transistors Pn and P6 are electrically coupled via node A. Due to this circuit arrangement, P-channel transistor Pn will turn on slowly and begin to conduct as the voltage applied to the Pn gate electrode (SPn) gradually decreases. As P-channel transistor Pn begins conducting, the voltage appearing at node C will increase correspondingly. As the voltage at node C continues to increase, so too does the voltage applied to the gate of N-channel transistor N3 (an enhancement mode transistor), which begins conducting when the voltage applied to the gate transistor N3 becomes sufficiently high.

Continuing the example above, as N-channel transistor N3 begins conducting, the voltage appearing at node B drops proportionally. The voltage appearing at node B will thus generally equalize with the voltage at SPn (again, the lowest sense point in this example), noting that transistors P4 and P5 and, therefore, corresponding respective transistors N1 and N3 remain in a non-conducting (or weakly conducting) state at this juncture. Concurrently, a current mirror arrangement is provided to regulate current flow through currently-conducting transistor Pn and to ground voltage rail 247, allowing the voltage appearing at node B to equalize with the sensed voltage (SPn) applied to the gate electrode of transistor Pn, as just described. The current mirror is part of a feedback loop that ensures the current in transistor P6 matches the current in transistor Pn as transistors P6 and Pn share the same source voltages, and the gate voltages of transistors P6 and Pn are equal. Accordingly, the gate of P-channel transistor P6 is electrically connected to node B such that, when the voltage appearing at node B is sufficiently low, transistor P6 turns on and begins conducting. As transistor P6 transitions to a conductive on state, current flows through transistor P6 to the current mirror arrangement formed by N-channel transistors N4-Nn in addition to diode-connected transistor N6. The voltage appearing at the commonly connected gate electrodes of transistors N4-Nn varies accordingly. Transistors N4-Nn can be equally sized and have substantially equivalent turn on voltages (VGS). N-channel transistors N4-Nn begin conducting when the common voltages applied to the gates of transistors N4-Nn becomes sufficiently high. As a result, current flow across P-channel transistor Pn is sunk to ground voltage rail 247, as is any current flow across transistors P4 and P5 in instances in which SP1, SP2 . . . SPn are substantially equivalent such that all of transistors P4 through Pn are in varying states of conduction. If the voltage at node B is less than reference voltage 126 then the undervoltage indicator will be asserted.

In the above-described manner, the combination of P-channel transistors P2, Pn, P6 and P3, and N-channel transistors N3, Nn and N6 form a buffer (unity gain) amplifier or voltage follower, ensuring that the voltage output at node B is determined by detected voltage applied to the gate electrode of P-channel transistor Pn as SPn. Concurrently, little to no current flows through P-channel transistors P4, P5 in the example scenario above. Thus, in this example scenario, the other branches of the circuit structure have no impact on the voltage output, providing that the voltages at SP1, SP2 are not equivalent to the voltage SPn. In a similar manner, should the lowest voltage appear at SP1 at a given time interval, P-channel transistor P4 will become the current minimum sense point transistor and cooperate with P-channel transistor P6 and N-channel transistor N1 to form a buffer amplifier reproducing the minimum sensed voltage (SP1) onto output node B in an analogous manner. Finally, should the lowest voltage appear at SP2, P-channel transistor P5 will become the current minimum sense point transistor and cooperate with P-channel transistor P6 and N-channel transistor N5 to form a buffer amplifier replicating the sensed voltage (SP2) onto output node B. The minimum voltage tracking circuit 118 shown in FIG. 2 may thus sense a plurality of voltages and output the lowest of the sensed voltages (or a voltage indicative of the lowest of the sensed voltages) at node B.

Figure 3:
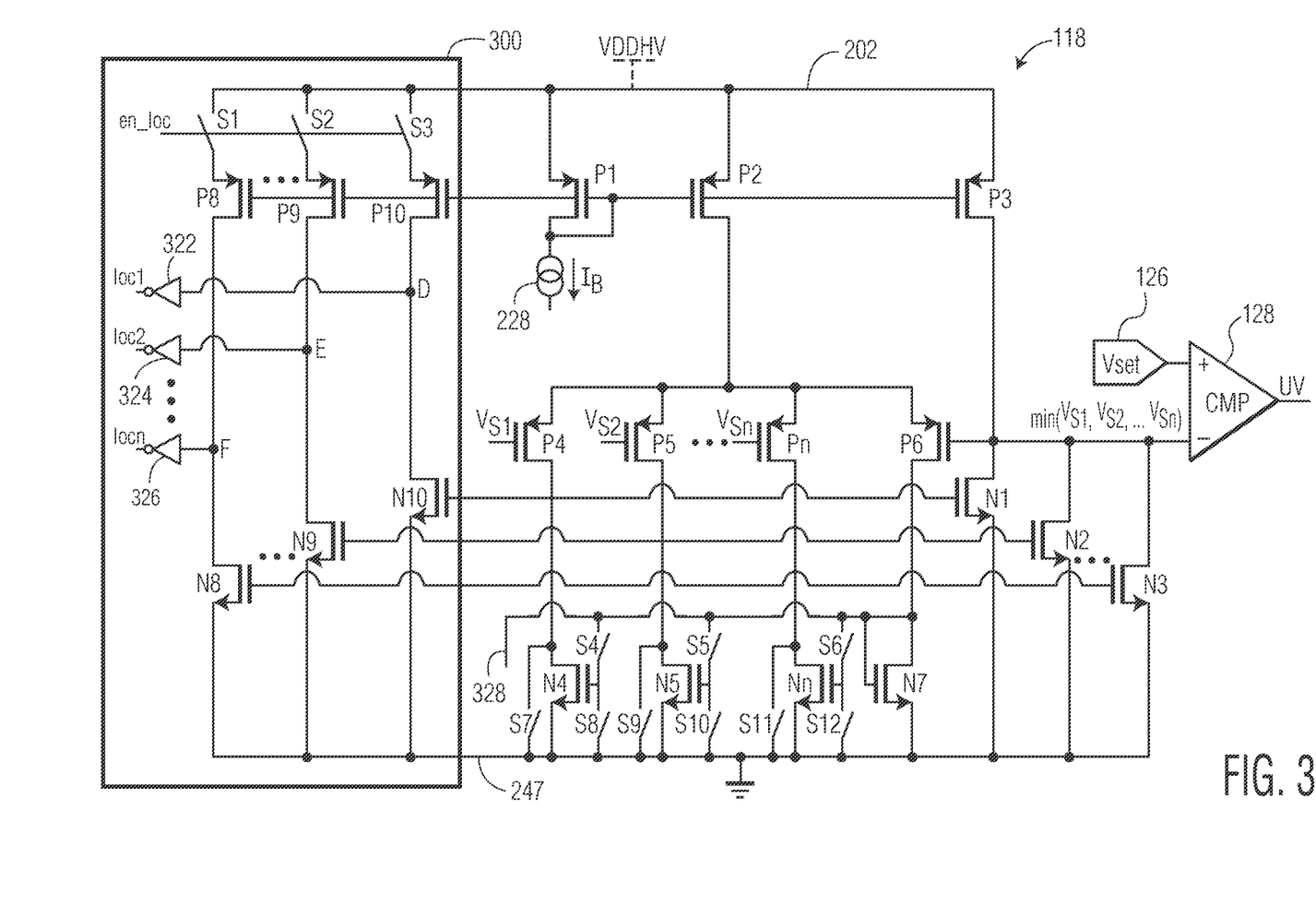
FIG. 3 illustrates a schematic diagram of another minimum voltage tracking circuit that can be used with the digital core power grid of FIG. 1 to identify a sense point triggering an undervoltage condition, and to selectively power gate selected portions of the minimum voltage tracking circuit, in accordance with selected embodiments of the invention.

In some cases, it may be beneficial to know which sense point SP1, SP2, SPn has triggered the under-voltage indicator. In addition, it can also be helpful to selectively power gate logic circuitry in the sea of gates that is not being used to reduce power consumption. In such cases, branches of minimum voltage tracking circuit 118 corresponding to power gated portions of the logic circuitry in the sea of gates can be disabled. FIG. 3 illustrates a schematic diagram of another minimum voltage tracking circuit 118 that can be used with digital core power grid 102 of FIG. 1 to identify a sense point triggering an undervoltage condition, and to selectively power gate selected portions of minimum voltage tracking circuit 118, in accordance with selected embodiments of the invention. This is useful during runtime optimization to provide flexibility to power gate sections of the digital logic that are currently not used and can also aid in optimizing multiple generations of chips.

An output stage circuit 300 for each of sense points SP1, SP2 . . . SPn as shown in FIG. 3 can be used to detect which location has triggered the under-voltage indicator. The location can be encoded with location bits LOC1, LOC2, . . . LOCn and stored in a status register or read out in real time to perform runtime optimization in various scenarios where load balancing shifts activity between multiple cores in a multi-core SoC.

In the example shown, output stage circuit 300 is coupled to minimum voltage tracking circuit 118 of FIG. 2 and includes switches S1, S2, S3, P-channel transistors P8, P9, P10, N-channel resistors N8, N9, N10, and inverters 324, 326, N8.

Since the location monitoring requires additional power, switches S1, S2, S3 can be provided to turn off location monitoring and save power. Switches S1, S2, S3 can be controlled by an enable switch EN_LOC and each of switches S1, S2, S3 can include a first terminal coupled to supply voltage rail 202 and a second terminal coupled to a source electrode of a respective P-channel transistor P8, P9, P10.

P-channel transistor P8 includes a source electrode coupled to the second terminal of switch S1, a drain electrode coupled to current source 228, and a gate electrode coupled to the drain electrode and to the gate electrodes of transistors P9, P10, P1, P2, P3. P-channel transistor P9 includes a source electrode coupled to the second terminal of switch S2, a drain electrode coupled to a drain electrode of N-channel transistor N10, and a gate electrode coupled to the gate electrodes of transistors P8, P10, P1, P2, P3. P-channel transistor P10 includes a source electrode coupled to second terminal of switch S3, a drain electrode coupled to a drain electrode of N-channel transistor N10, and a gate electrode coupled to the gate electrodes of P-channel transistors P8, P9, P1, P2, P3.

N-channel transistor N8 further includes a control gate coupled to the drain electrode of P-channel transistor Pn, the drain electrode of N-channel transistor Nn, and the control gate of N-channel transistor N3, and a source electrode coupled to ground voltage rail 247. N-channel transistor N9 further includes a control gate coupled to the drain electrode of P-channel transistor P5, the drain electrode of N-channel transistor N5, and the control gate of N-channel transistor N2, and a source electrode coupled to ground voltage rail 247. N-channel transistor N10 further includes a control gate coupled to the drain electrode of P-channel transistor P4, the drain electrode of N-channel transistor N4, and the control gate of N-channel transistor N1, and a source electrode coupled to ground voltage rail 247.

Inverter 322 includes an input coupled to the drain electrode of P-channel transistor S3 and N-channel transistor N10, and an output that provides a first location signal LOC1. Inverter 324 includes an input coupled to the drain electrodes of P-channel transistor S2 and N-channel transistor N9, and an output that provides a second location signal LOC2. Inverter 326 includes an input coupled to the drain electrodes of P-channel transistor P8 and N-channel transistor N8, and an output that provides an nth location signal LOCn.

Minimum voltage tracking circuit 118 can include as many switches S1, S2, S3 and respective P-channel transistors P8, P9, P10 and inverters 324, 326, N8 as there are conductors 120, 122, 124 coupled to sense points SP1, SP2, SPn in power grid 102 (FIG. 1).

During operation with the enable location signal EN_LOC asserted, switches S1, S2, S3 will be closed. Transistor P1 forms a current mirror with transistors P8, P9 and P10. Consider an example where the lowest voltage is VS1 at the gate electrode of P-channel transistor P4, the gate electrode of N-channel transistor N10 is connected to the drain electrodes of transistors P4 and N1. Transistor N10 will be in conductive mode while transistors N8 and N9 will be in nonconductive mode. The current mirror between transistors P1 and P 10, and transistor N10 form an amplifier. The voltage at node D will be pulled down by transistor N10 while the voltage at nodes E and F will be pulled by respective transistors P8 and P9. The input to inverter 322 will be low and the output of inverter 322 will be high. The output of inverters 324, 326 will be low due to their inputs at nodes E and F being high. The LOC1 signal output by inverter 322 will indicate sense point SP1 as having the minimum voltage compared to the other sense points SP2, SPn. Similarly, if the lowest voltage is at the control gate of P-channel transistor P5 or Pn, the corresponding location signal LOC2 or LOCn will indicate the respective sense point SP2 or SPn with the minimum voltage.

To avoid sensing domains that are power gated, minimum voltage tracking circuit 118 can use switches S4 through S12 that are connected to allow transistors N4-Nn to be disabled without triggering an undervoltage detection event. Conductive line 328 is selectively connected between ground and the drain electrode of transistor N6 through operation of switch S7. Switches S4-S6 include a first terminal coupled to conductive line 328 and a second terminal coupled to the gate electrodes of respective transistors N4-Nn. The gate electrode of transistor N6 is also coupled to conductive line 328. Switches S7-S12 each include a first terminal coupled to ground voltage rail 247. As mentioned previously they first terminal of switch S7 this coupled to the drain electrode of transistor N6. The second terminal of switch S8 is coupled to the gate electrode of transistor N4. The second terminal of switch S9 is coupled to the drain electrode of transistor N5. The second terminal of switch S10 is coupled to the gate electrode of transistor N5. The second terminal of switch S11 is coupled to the drain electrode of transistor Nn. The second terminal of switch S12 is coupled to the gate electrode of transistor Nn.

To disable transistors N4-Nn, switches S7-S12 are closed and switches S4-S6 are open. By closing switch S7, the drain and gate electrodes of transistor N6 are coupled to ground. Closing switches S8-S12 couples the gate electrode of transistor N4 and the drain and gate electrodes of transistors N5-N6 to ground. Opening switches S4-S6 disconnects the gate electrodes of transistors N4-Nn from the gate and drain electrodes of transistor N6 and the drain electrode of transistor P6, thereby removing the current mirror functionality of transistors N4-N6.

Conversely, to enable transistors N4-Nn, switches S7-S12 are open and switches S4-S6 are closed. Opening switches S8-S12 decouples the gate electrode of transistor N4 and the drain and gate electrodes of transistors N5-N6 from ground. Closing switches S4-S6 connects the gate electrodes of transistors N4-Nn to the gate and drain electrodes of transistor N6 and the drain electrode of transistor P6.

Other suitable techniques to selectively disable inputs, for example, disconnecting the source electrodes of transistors P4-P6 or the source electrodes of transistors N4-Nn, among others, can be used to save power when minimum voltage tracking circuit 118 is not being used.

Figure 4:
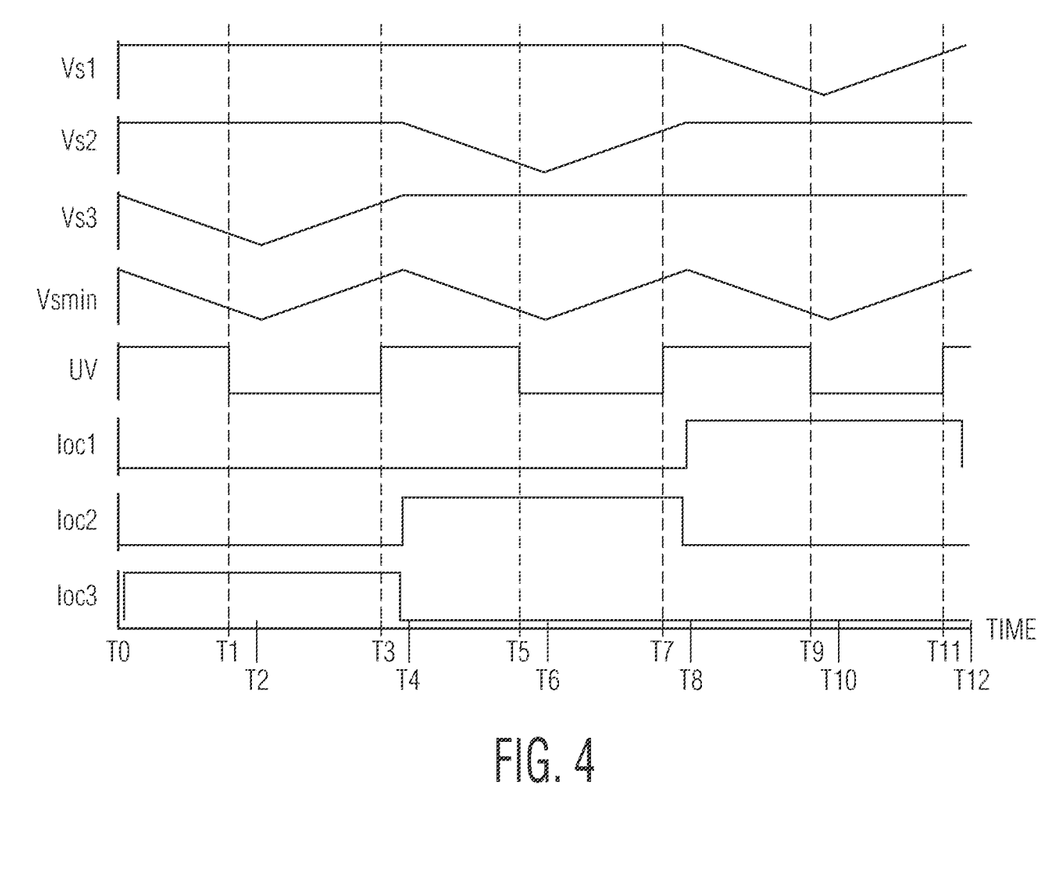
FIG. 4 shows an example of a set of waveforms for various signals in the low-voltage detector of FIG. 3.

FIG. 4 shows an example of a set of waveforms for various signals during a simulated operation of minimum voltage tracking circuit 118 of FIG. 3 with load current being drawn at sense points SP4, SP2, and SP1, in that order. At time T0, sensed voltage VS3 begins to decrease, indicating a current load at sense point SP4. At time T0, the output of minimum voltage tracking circuit 118, shown by timeline VSMIN, starts decreasing linearly, following the voltage VS3, until VS3 and VSMIN reach a low point at time T2. At time T1, just before VS3 and VSMIN cross the comparator reference voltage 126 the undervoltage signal UV output by comparator 128 (FIG. 3) transitions from high to low, which indicates that VSMIN is smaller than the reference voltage input to the non-inverting terminal of comparator 128. As the current drawn at sense point SP4 decreases, sense point voltage VS3 and the output voltage VSMIN of minimum voltage tracking circuit 118 begin increasing until time T4. The undervoltage signal UV output by comparator 128 (FIG. 3) transitions from low to high at time T3 as the output of minimum voltage tracking circuit 118 becomes less than the reference voltage input to comparator 128. Note that there can be hysteresis in comparator 128 to avoid toggling the output of comparator 128 unnecessarily, as shown by the time history of signal UV in FIG. 4. Location signal LOC3 is asserted from time T0 until time T4, indicating sense point SP4 registered the minimum voltage compared to sense points SP1 or SP2 during time T0 to time T4.

At time T4, sensed voltage VS2 begins to decrease, indicating a current load at sense point SP2. At time T4, the output of minimum voltage tracking circuit 118, shown by timeline VSMIN, starts decreasing linearly, following the voltage VS2, until VS2 and VSMIN reach a low point at time T6. At time T5, VS2 and VSMIN fall below the comparator trip point defined by reference voltage 126, the undervoltage signal UV output by comparator 128 (FIG. 3) transitions from high to low, which indicates that VSMIN is smaller than the reference voltage input to the non-inverting terminal of comparator 128. As the current drawn at sense point SP2 decreases, sense point voltage VS2 and the output voltage VSMIN of minimum voltage tracking circuit 118 begin increasing until time T8. The undervoltage signal UV output by comparator 128 (FIG. 3) transitions from low to high at time T7 as the output of minimum voltage tracking circuit 118 becomes less than the reference voltage input to comparator 128. Again, comparator 128 shows hysteresis to avoid toggling the output of comparator 128 unnecessarily, as shown by the time history of signal UV from time T3 to time T7 in FIG. 4. Location signal LOC2 is asserted from time T4 until time T8, indicating sense point SP2 registered the minimum voltage compared to sense points SP1 or SP4 during time T4 to time T8.

At time T8, sensed voltage VS1 begins to decrease, indicating a current load at sense point SP1At T8, the output of minimum voltage tracking circuit 118, shown by timeline VSMIN, starts decreasing linearly, following the voltage VS1, until VS1 and VSMIN reach a low point at time T10. At time T9, VS1 and VSMIN fall below the comparator trip point defined by 126, the undervoltage signal UV output by comparator 128 (FIG. 3) transitions from high to low, which indicates that VSMIN is smaller than the reference voltage input to the non-inverting terminal of comparator 128. As the current drawn at sense point SP1 decreases, sense point voltage VS1 and the output voltage VSMIN of minimum voltage tracking circuit 118 begin increasing until time T12. The undervoltage signal UV output by comparator 128 (FIG. 3) transitions from low to high at time T11 as the output of minimum voltage tracking circuit 118 becomes less than the reference voltage input to comparator 128. Again, comparator 128 shows hysteresis to avoid toggling the output of comparator 128 unnecessarily, as shown by the time history of signal UV from time T7 to time T11 in FIG. 4. Location signal LOC1 is asserted from time T8 until time T12, indicating sense point SP1 registered the minimum voltage compared to sense points SP1 or SP4 during time T8 to time T12.

Figure 5:
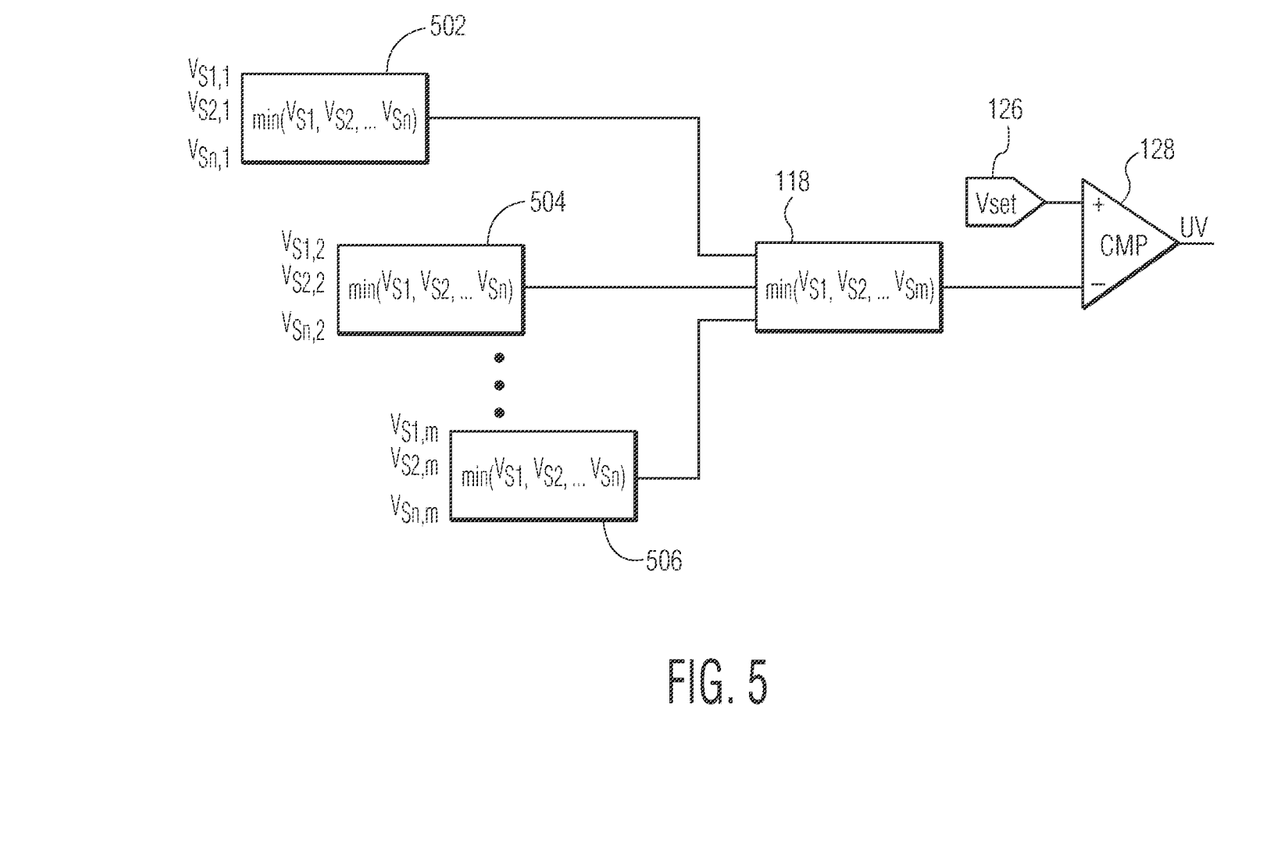
FIG. 5 illustrates an example of minimum voltage tracking circuits coupled in parallel and in series with one another that can be used to track minimum voltage at multiple points in the power grid of FIG. 1.

P-channel transistors P4, P5, Pn can be referred to as a minimum voltage copier circuit that can theoretically support an arbitrary number sense voltages. In practice, however, too many voltages may diminish the speed of the circuit. Additionally, leakage currents can place a lower limit on the bias currents for a large number of inputs. FIG. 5 illustrates an example of a configuration of minimum voltage tracking circuits 502, 504, 506, 118 that can be used to detect minimum voltage at multiple points in the power grid of FIG. 1 when a large number of voltages in a power grid are being sensed. Minimum voltage tracking circuits 502, 504, 506 can be configured similar to minimum voltage tracking circuit 118 shown in FIG. 2 or FIG. 3. The output of each minimum voltage tracking circuit 502, 504, 506 is coupled to a respective input of minimum voltage tracking circuit 118.

Minimum voltage tracking circuit 502 is coupled to sense voltages VS1,1, VS2,1, VSn,1. The output of minimum voltage tracking circuit 502 is provided as a first sensed voltage VS1 to minimum voltage tracking circuit 118. Minimum voltage tracking circuit 504 is coupled to sense voltages VS1,2, VS2,2, VSn,2. The output of minimum voltage tracking circuit 504 is provided as a second sensed voltage VS2 to minimum voltage tracking circuit 118. Minimum voltage tracking circuit 506 is coupled to sense voltages VS1,m, VS2,m, VSn,m. The output of minimum voltage tracking circuit 506 is provided as an mth sensed voltage VSm to minimum voltage tracking circuit 118. In this manner of parallel and series connections of minimum voltage tracking circuits 502, 504, 506, 118, a large number of sense points may be monitored without slowing down the speed of minimum voltage tracking circuits 502, 504, 506, 118 to the point that they would not be able to function properly.

By now it should be appreciated that in some embodiments, there has been provided an integrated circuit that can comprise a comparator having a first input (+) configured to receive a reference voltage, a second input (−), and an output configured to provide an under-voltage (UV) indicator; a plurality of sense points configured to provide a plurality of sense point voltages (Vs1, Vs2, . . . Vsn), each sense point of the plurality of sense points providing a corresponding sense point voltage of the plurality of sense point voltages; and a minimum voltage tracking circuit (e.g. P4-Pn) configured to receive the plurality of sense point voltages and provide an output voltage (min(Vs1, Vs2, . . . Vsn)) which tracks whichever sense point voltage of the plurality of sense point voltages is currently a minimum sense point voltage of the plurality of sense point voltages. The comparator can be configured to receive the output voltage at the second input and assert the UV indicator when the output voltage is below the reference voltage.

In another aspect, the comparator can be configured to negate the UV indicator when the output voltage is above the reference voltage.

In another aspect, the minimum voltage tracking circuit ca comprise a plurality of transistor branches corresponding to the plurality of sense point voltages and coupled in parallel with each other between a first circuit node and a second circuit node (e.g. gnd), each transistor branch having a corresponding first transistor (e.g. P4-Pn) whose gate electrode can be coupled to receive a corresponding sense point voltage of the plurality of sense point voltages.

In another aspect, the corresponding first transistor of each transistor branch of the plurality of transistor branches can have a first current electrode (e.g. top current electrode, or source), wherein the first current electrodes of the corresponding first transistors of the plurality of transistor branches are coupled to the first circuit node and wherein the minimum voltage tracking circuit further comprises a feedback transistor branch, wherein a corresponding first transistor (Pn) of the feedback transistor branch has a first current electrode (e.g. top current electrode, or source) coupled to the first circuit node and a gate electrode coupled to provide the output voltage to the second input of the comparator.

In another aspect, the feedback transistor branch can be configured to close a feedback loop with a transistor branch of the plurality of transistor branches which corresponds to the minimum sense point voltage of the plurality of sense point voltages such that the gate electrode of the corresponding first transistor (Pn) of the transistor feedback branch tracks the minimum sense point voltage.

In another aspect, the minimum voltage tracking circuit can comprise disable circuitry (e.g. S4-S12, etc.) configured to selectively remove one or more sense point voltages from the plurality of sense point voltages such that, regardless of voltage values of the one or more sense point voltages, the removed one or more sense point voltages cannot be tracked as the minimum sense point voltage of the plurality of sense point voltages.

In another aspect, each transistor branch of the plurality of transistor branches can have a corresponding second transistor (e.g. N4, N5, Nn) whose first current electrode can be coupled to a second current electrode of the corresponding first transistor and whose second current electrode can be coupled to the second circuit node.

In another aspect, each transistor branch of the plurality of transistor branch can have a corresponding third transistor (e.g. N4, N5, Nn) whose gate electrode can be coupled to the second current electrode of the corresponding first transistor, whose first current electrode can be coupled to the gate electrode of the corresponding first transistor (Pn) of the feedback transistor branch, and whose second current electrode can be coupled to the second circuit node.

In another aspect, the corresponding first transistors are p-type transistors, and the corresponding second and third transistors are n-type transistors.

In another aspect, the integrated circuit can further comprise a location indicator circuit coupled to the corresponding second current electrodes of the corresponding first transistors of the plurality of transistor branches, wherein the location indicator circuit can be configured to assert a location indicator of a plurality of location indicators corresponding to the sense point of the plurality of sense points which provides the corresponding sense point voltage of the plurality of sense point voltages that is currently the minimum sense point voltage.

In another aspect, the integrated circuit can further comprise a location indicator circuit configured to provide a plurality of location indicators, each location indicator corresponding to a sense point of the plurality of sense points.

In another aspect, the location indicator circuit can be configured to assert a location indicator of the plurality of location indicators corresponding to the sense point which provides the corresponding sense point voltage of the plurality of sense point voltages that is currently the minimum sense point voltage.

In another aspect, the minimum voltage tracking circuit can comprise a plurality of first level tracking circuits (e.g. 502, 504, 506), each configured to receive a corresponding portion of the plurality of sense point voltages and provide a corresponding first level output which tracks whichever sense point voltage of the corresponding portion of sense point voltages is currently a minimum sense point voltage of the corresponding portion of sense point voltages; and a second level tracking circuit (e.g. 118 in FIG. 4) configured to receive the corresponding first level outputs and provide the output voltage.

In other embodiments, an integrated circuit can comprise a plurality of sense points configured to provide a plurality of sense point voltages (Vs1, Vs2, . . . Vsn), each sense point of the plurality of sense points providing a corresponding sense point voltage of the plurality of sense point voltages; a minimum voltage tracking circuit (e.g. P4-Pn) configured to receive the plurality of sense point voltages and provide an output voltage (min(Vs1, Vs2, . . . Vsn) which tracks whichever sense point voltage of the plurality of sense point voltages is currently a minimum sense point voltage of the plurality of sense point voltages; a location indicator circuit configured to provide a plurality of location indicators, each location indicator corresponding to a sense point of the plurality of sense points, wherein the location indicator circuit can be configured to assert a location indicator of the plurality of location indicators corresponding to the sense point which provides the corresponding sense point voltage of the plurality of sense point voltages that is currently the minimum sense point voltage.

In another aspect, the minimum voltage tracking circuit can comprise a plurality of transistor branches corresponding to the plurality of sense point voltages and coupled in parallel with each other between a first circuit node and a second circuit node (e.g. gnd), each transistor branch having a corresponding transistor (e.g. P4-Pn) whose gate electrode can be coupled to receive a corresponding sense point voltage of the plurality of sense point voltages, and the location indicator circuit can have a plurality of inputs coupled to the plurality of transistor branches such that each location indicator of the plurality of location indicators can be generated from a corresponding transistor branch of the plurality of transistor branches.

In another aspect, a corresponding transistor of each transistor branch of the plurality of transistor branches can have a corresponding first current electrode, wherein the first current electrodes of the corresponding transistors of the plurality of transistor branches can be coupled to the first circuit node and wherein the minimum voltage tracking circuit further comprises a feedback transistor branch, wherein a corresponding transistor (Pn) of the feedback transistor branch has a first current electrode coupled to the first circuit node and a gate electrode coupled to provide the output voltage to the second input of the comparator.

In another aspect, the feedback transistor branch can be configured to close a feedback loop with a transistor branch of the plurality of transistor branches which corresponds to the minimum sense point voltage of the plurality of sense point voltages such that the gate electrode of the corresponding first transistor (Pn) of the transistor feedback branch tracks the minimum sense point voltage.

In another aspect, the minimum voltage tracking circuit can comprise a plurality of first level tracking circuits (e.g. 502, 504, 506), each configured to receive a corresponding portion of the plurality of sense point voltages and provide a corresponding first level output which tracks whichever sense point voltage of the corresponding portion of sense point voltages is currently a minimum sense point voltage of the corresponding portion of sense point voltages; and a second level tracking circuit (e.g. 118 in FIG. 4) configured to receive the corresponding first level outputs and provide the output voltage.

In still further embodiments, in an integrated circuit having a plurality of sense points configured to provide a plurality of sense point voltages (Vs1, Vs2, . . . Vsn), wherein each sense point of the plurality of sense points provides a corresponding sense point voltage of the plurality of sense point voltages, a method can comprise in response to a first sense point voltage of the plurality of sense point voltages being a minimum sense voltage of the plurality of sense point voltages, tracking, by a minimum voltage tracking circuit, the first sense point voltage to provide a minimum voltage output. After the tracking the first sense point voltage, in response to a second sense point voltage of the plurality of sense point voltages, different from the first sense point voltage, being the minimum sense point voltage of the plurality of sense point voltages, tracking, by the minimum voltage tracking circuit, the second sense point voltage instead of the first sense point voltage to provide the minimum voltage output; and using a comparator which receives a reference voltage at a first input and the minimum voltage output at a second input, asserting a low voltage detection indicator at an output of the comparator while the minimum voltage output is below a reference voltage, and negating the low voltage detection indicator while the minimum voltage output is above the reference voltage.

Another aspect, the method can further comprise, when the low voltage detection indicator is asserted, providing a location indicator to indicate which sense point of the plurality of sense points is being tracked to provide the minimum voltage output.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a comparator having a first input configured to receive a reference voltage, a second input, and an output configured to provide an under-voltage (UV) indicator;
   a plurality of sense points configured to provide a plurality of sense point voltages, each sense point of the plurality of sense points providing a corresponding sense point voltage of the plurality of sense point voltages; and
   a minimum voltage tracking circuit configured to receive the plurality of sense point voltages and provide an output voltage which tracks whichever sense point voltage of the plurality of sense point voltages is currently a minimum sense point voltage of the plurality of sense point voltages, the minimum voltage tracking circuit comprising:
      a plurality of transistor branches corresponding to the plurality of sense point voltages and coupled in parallel with each other between a first circuit node and a second circuit node, each transistor branch having a corresponding first transistor whose gate electrode is coupled to receive a corresponding sense point voltage of the plurality of sense point voltages, and
      a feedback transistor branch;
   wherein the comparator is configured to receive the output voltage at the second input and assert the UV indicator when the output voltage is below the reference voltage,
   wherein:
      the corresponding first transistor of each transistor branch of the plurality of transistor branches has a first current electrode, wherein the first current electrodes of the corresponding first transistors of the plurality of transistor branches are coupled to the first circuit node, and
      wherein a corresponding first transistor of the feedback transistor branch has a first current electrode coupled to the first circuit node and a gate electrode coupled to provide the output voltage to the second input of the comparator.

2. The integrated circuit of claim 1, wherein the comparator is configured to negate the UV indicator when the output voltage is above the reference voltage.

3. The integrated circuit of claim 1, wherein the feedback transistor branch is configured to close a feedback loop with a transistor branch of the plurality of transistor branches which corresponds to the minimum sense point voltage of the plurality of sense point voltages such that the gate electrode of the corresponding first transistor of the transistor feedback branch tracks the minimum sense point voltage.

4. The integrated circuit of claim 1, wherein the minimum voltage tracking circuit comprises disable circuitry configured to selectively remove one or more sense point voltages from the plurality of sense point voltages such that, regardless of voltage values of the one or more sense point voltages, the removed one or more sense point voltages cannot be tracked as the minimum sense point voltage of the plurality of sense point voltages.

5. The integrated circuit of claim 1, wherein each transistor branch of the plurality of transistor branches has a corresponding second transistor whose first current electrode is coupled to a second current electrode of the corresponding first transistor of the transistor branch and whose second current electrode is coupled to the second circuit node.

6. The integrated circuit of claim 5, wherein each transistor branch of the plurality of transistor branches has a corresponding third transistor whose gate electrode is coupled to the second current electrode of the corresponding first transistor of the transistor branch, whose first current electrode is coupled to the gate electrode of the corresponding first transistor of the feedback transistor branch, and whose second current electrode is coupled to the second circuit node.

7. The integrated circuit of claim 6, wherein the corresponding first transistors of the plurality of transistor branches are p-type transistors, and the corresponding second and third transistors of the plurality of transistor branches are n-type transistors.

8. The integrated circuit of claim 6, further comprising:
a location indicator circuit coupled to the corresponding second current electrodes of the corresponding first transistors of the plurality of transistor branches, wherein the location indicator circuit is configured to assert a location indicator of a plurality of location indicators corresponding to the sense point of the plurality of sense points which provides the corresponding sense point voltage of the plurality of sense point voltages that is currently the minimum sense point voltage.

9. The integrated circuit of claim 1, further comprising:
a location indicator circuit configured to provide a plurality of location indicators, each location indicator corresponding to a sense point of the plurality of sense points.

10. The integrated circuit of claim 9, wherein the location indicator circuit is configured to assert a location indicator of the plurality of location indicators corresponding to the sense point which provides the corresponding sense point voltage of the plurality of sense point voltages that is currently the minimum sense point voltage.

11. The integrated circuit of claim 1, wherein the minimum voltage tracking circuit comprises:
a plurality of first level tracking circuits, each configured to receive a corresponding portion of the plurality of sense point voltages and provide a corresponding first level output which tracks whichever sense point voltage of the corresponding portion of sense point voltages is currently a minimum sense point voltage of the corresponding portion of sense point voltages; and
a second level tracking circuit configured to receive the corresponding first level outputs and provide the output voltage.

12. An integrated circuit comprising:
a plurality of sense points configured to provide a plurality of sense point voltages, each sense point of the plurality of sense points providing a corresponding sense point voltage of the plurality of sense point voltages;
a minimum voltage tracking circuit configured to receive the plurality of sense point voltages and provide an output voltage which tracks whichever sense point voltage of the plurality of sense point voltages is currently a minimum sense point voltage of the plurality of sense point voltages; and a location indicator circuit configured to provide a plurality of location indicators, each location indicator corresponding to a sense point of the plurality of sense points, wherein the location indicator circuit is configured to assert a location indicator of the plurality of location indicators corresponding to the sense point which provides the corresponding sense point voltage of the plurality of sense point voltages that is currently the minimum sense point voltage,
wherein:
the minimum voltage tracking circuit comprises a plurality of transistor branches corresponding to the plurality of sense point voltages and coupled in parallel with each other between a first circuit node and a second circuit node, each transistor branch having a corresponding transistor whose gate electrode is coupled to receive a corresponding sense point voltage of the plurality of sense point voltages, and
the location indicator circuit has a plurality of inputs coupled to the plurality of transistor branches such that each location indicator of the plurality of location indicators is generated from a corresponding transistor branch of the plurality of transistor branches.

13. The integrated circuit of claim 12, wherein a corresponding transistor of each transistor branch of the plurality of transistor branches has a corresponding first current electrode, wherein the first current electrodes of the corresponding transistors of the plurality of transistor branches is coupled to the first circuit node and wherein the minimum voltage tracking circuit further comprises:
a feedback transistor branch, wherein a corresponding transistor of the feedback transistor branch has a first current electrode coupled to the first circuit node and a gate electrode coupled to provide the output voltage to the second input of the comparator.

14. The integrated circuit of claim 13, wherein the feedback transistor branch is configured to close a feedback loop with a transistor branch of the plurality of transistor branches which corresponds to the minimum sense point voltage of the plurality of sense point voltages such that the gate electrode of the corresponding first transistor of the transistor feedback branch tracks the minimum sense point voltage.

15. The integrated circuit of claim 12, wherein the minimum voltage tracking circuit comprises:
a plurality of first level tracking circuits, each configured to receive a corresponding portion of the plurality of sense point voltages and provide a corresponding first level output which tracks whichever sense point voltage of the corresponding portion of sense point voltages is currently a minimum sense point voltage of the corresponding portion of sense point voltages; and
a second level tracking circuit configured to receive the corresponding first level outputs and provide the output voltage.

16. In an integrated circuit having a plurality of sense points configured to provide a plurality of sense point voltages, wherein each sense point of the plurality of sense points provides a corresponding sense point voltage of the plurality of sense point voltages, a method comprising:
in response to a first sense point voltage of the plurality of sense point voltages being a minimum sense voltage of the plurality of sense point voltages, tracking, by a first transistor branch of a minimum voltage tracking circuit, the first sense point voltage to provide a minimum voltage output, wherein a control electrode of a first transistor of the first transistor branch is coupled to receive the first sense point voltage;

after the tracking the first sense point voltage, in response to a second sense point voltage of the plurality of sense point voltages, different from the first sense point voltage, being the minimum sense point voltage of the plurality of sense point voltages, tracking, by a second transistor branch of the minimum voltage tracking circuit, the second sense point voltage instead of the first sense point voltage to provide the minimum voltage output, wherein a control electrode of a second transistor of the second transistor branch is coupled to receive the second sense point voltage and the second transistor branch is coupled in parallel with the first transistor branch; and using a comparator which receives the reference voltage at a first input and the minimum voltage output at a second input, asserting a low voltage detection indicator at an output of the comparator while the minimum voltage output is below a reference voltage, and negating the low voltage detection indicator while the minimum voltage output is above the reference voltage.

17. The method of claim 16, further comprising:

when the low voltage detection indicator is asserted, providing a location indicator to indicate which sense point of the plurality of sense points is being tracked to provide the minimum voltage output.

\* \* \* \* \*